(12) United States Patent
Yueh et al.

(10) Patent No.: US 10,985,148 B2
(45) Date of Patent: Apr. 20, 2021

(54) ELECTRONIC DEVICE

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/234,093

(22) Filed: Dec. 27, 2018

(65) Prior Publication Data

US 2020/0212021 A1 Jul. 2, 2020

(51) Int. Cl.

| H01L 25/16 | (2006.01) |
|---|---|
| H01L 27/144 | (2006.01) |
| H01L 31/02 | (2006.01) |
| H01L 31/0232 | (2014.01) |
| H01L 31/105 | (2006.01) |
| H01L 31/167 | (2006.01) |
| G09G 3/32 | (2016.01) |

(52) U.S. Cl.
CPC ........ *H01L 25/167* (2013.01); *H01L 27/1443* (2013.01); *H01L 31/02005* (2013.01); *H01L 31/02019* (2013.01); *H01L 31/02327* (2013.01); *H01L 31/105* (2013.01); *H01L 31/167* (2013.01); *G09G 3/32* (2013.01); *G09G 2300/026* (2013.01); *G09G 2320/0233* (2013.01)

(58) Field of Classification Search
CPC ............... H01L 25/167; H01L 27/1443; H01L 31/02005; H01L 31/02019; H01L 31/02327; H01L 31/105; H01L 31/167; H01L 27/3269; H01L 25/16; H01L 23/047; H01L 31/00–208; G09G 3/32; G09G 2300/026; G09G 2360/145; G09G 3/20

See application file for complete search history.

(56) References Cited

U.S. PATENT DOCUMENTS

| 2011/0109532 | A1* | 5/2011 | Choi .................... | H01L 27/3269 345/76 |
|---|---|---|---|---|
| 2015/0008842 | A1* | 1/2015 | Harbers ................. | H05B 45/00 315/291 |
| 2015/0022754 | A1 | 1/2015 | Jepsen et al. | |
| 2015/0382426 | A1* | 12/2015 | Odnoblyudov ....... | H01L 25/167 315/151 |
| 2016/0375161 | A1* | 12/2016 | Hawkins ............. | F21V 23/0442 422/22 |
| 2017/0287392 | A1 | 10/2017 | Lynch et al. | |
| 2018/0082631 | A1 | 3/2018 | Chang et al. | |
| 2018/0166007 | A1 | 6/2018 | Hyeon | |
| 2020/0105194 | A1* | 4/2020 | Kim ....................... | H04N 7/144 |

FOREIGN PATENT DOCUMENTS

| CN | 107146572 A | 9/2017 |
|---|---|---|
| CN | 108649059 A | 10/2018 |
| WO | WO-2017/096938 A1 | 6/2017 |

* cited by examiner

*Primary Examiner* — Shahed Ahmed
(74) *Attorney, Agent, or Firm* — Muncy, Geissler, Olds & Lowe, P.C.

(57) ABSTRACT

An electronic device is disclosed, which comprises: a substrate; a plurality of sensing elements disposed on the substrate; and a plurality of electronic modules disposed on the substrate, each electronic module comprising a plurality of electronic elements, wherein the plurality of electronic modules are arranged in a manner to expose the plurality of sensing elements.

18 Claims, 10 Drawing Sheets

ELECTRONIC DEVICE

BACKGROUND

1. Field

The present disclosure relates to an electronic device. More specifically, the present disclosure relates to an electronic device comprising tiled electronic modules.

2. Description of Related Art

With the continuous advancement of technologies related to display devices, the applications of the display devices are not limited to monitors, mobile phones, laptops, televisions, etc. Nowadays, tiled display device or tiled display systems are developed to extend the applications of the display devices to video walls, advertising boards, and other electronic devices for displaying large images.

However, the tiled display device or the tiled display system may suffer from the problem that the properties of the electronic modules comprised therein are different, resulting in that the whole image displayed thereon is non-uniform.

Therefore, it is desirable to provide a novel tiled display device or tiled display system which can display uniform image.

SUMMARY

The present disclosure provides an electronic device, which comprises: a substrate; a plurality of sensing elements disposed on the substrate; and a plurality of electronic modules disposed on the substrate, each electronic module comprising a plurality of electronic elements, wherein the plurality of electronic modules are arranged in a manner to expose the plurality of sensing elements.

The present disclosure further provides another electronic device, which comprises: a substrate; a plurality of sensing elements disposed on the substrate; and a plurality of electronic modules disposed on the substrate, each electronic module comprising a plurality of electronic elements, wherein at least two of the electronic modules are sensed by at least one of the sensing elements.

The present disclosure also provides another electronic device, which comprises: a substrate; a plurality of sensing elements disposed on the substrate; and a plurality of electronic modules disposed on the substrate; wherein at least one of the plurality of electronic modules comprises a plurality of electronic elements, and the plurality of electronic modules are arranged in a manner to expose the plurality of sensing elements.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

Furthermore, the terms "about", "nearly", "almost", "approximately", or "substantially" are usually expressed within 20% of a given value or range, or within 10%, or within 5%, or within 3%, or within 2%, or within 1%, or within 0.5%. The quantity given here is an approximate quantity, that is, in the absence of specific descriptions of "about", "nearly", "almost", "approximately", or "substantially", the meaning of "about", "nearly", "almost", "approximately", or "substantially" may still be implied.

In addition, the features in different embodiments of the present disclosure can be mixed to form another embodiment.

Figure 1:
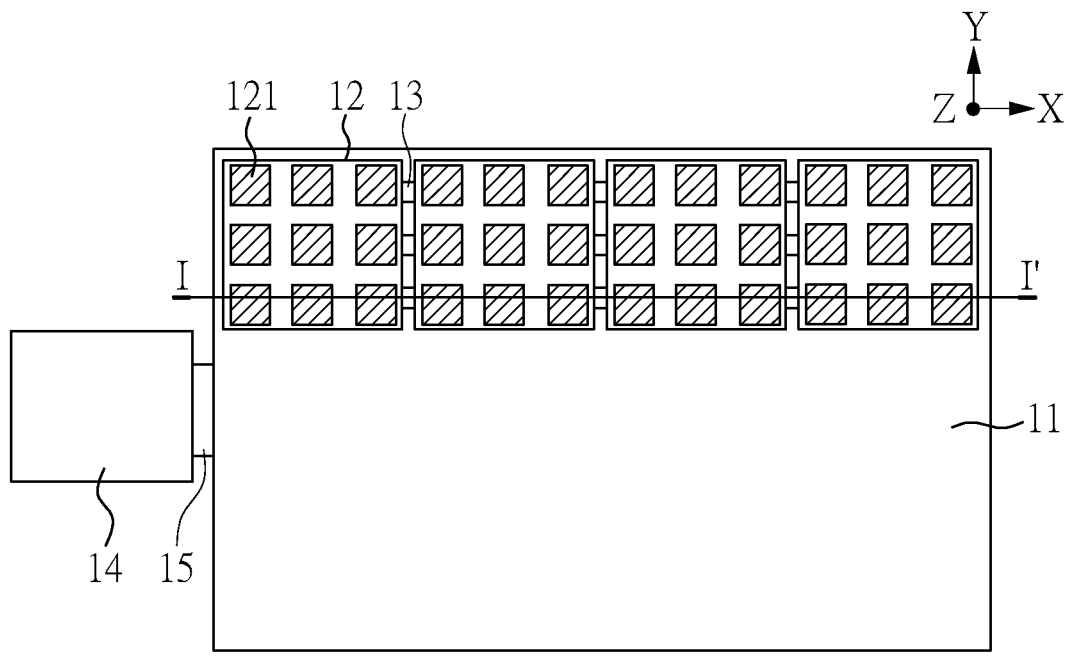
FIG. 1 is a top view of an electronic device according to one embodiment of the present disclosure.

FIG. 1 is a top view of an electronic device according to one embodiment of the present disclosure. The electronic device of the present embodiment comprises: a substrate 11; a plurality of sensing elements 13 disposed on the substrate 11; and a plurality of electronic modules 12 disposed on the substrate 11, wherein each of the electronic modules 12 comprises a plurality of electronic elements 121. In some other embodiments, at least one electronic module 12 comprises a plurality of electronic elements 121. In addition, the electronic device of the present embodiment may further comprise a controller 14 electrically connected to the substrate 11. Herein, the controller 14 is electrically connected to the substrate 11 via a circuit board 15. In addition, the controller 14 can be a timing controller (T-con controller), but the present disclosure is not limited thereto.

In the present embodiment, the electronic modules 12 are disposed on the substrate 11 and arranged in juxtaposition to form a tiled electronic device. In FIG. 1, not all the electronic modules 12 but only four electronic modules 12 are shown. However, the present disclosure is not limited thereto. The number and the arrangement of the electronic modules 12 can be adjusted according to the actual demand. In addition, in FIG. 1, each of the electronic modules 12 comprises nine electronic elements 121, but the present disclosure is not limited thereto. The number and the arrangement of the electronic elements 121 can be adjusted according to the actual demand.

Figure 2A:
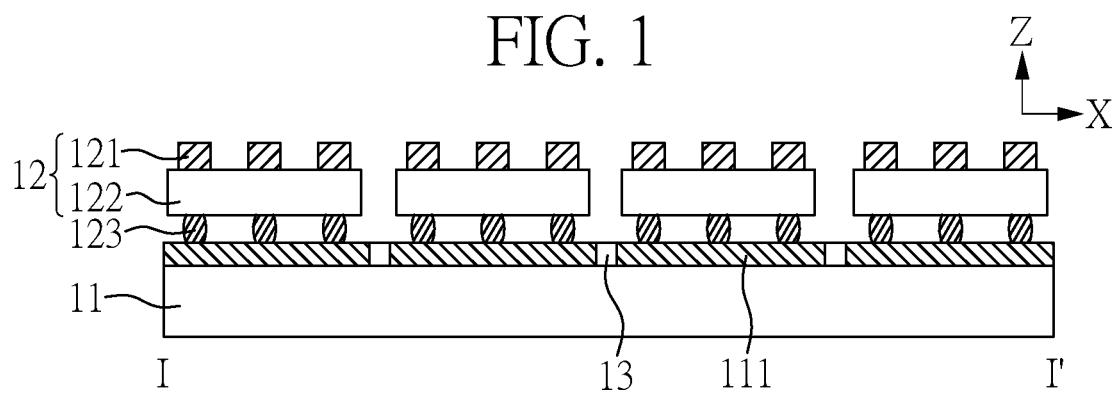
FIG. 2A and FIG. 2B are cross-sectional views of electronic devices according to different embodiments of the present disclosure.

FIG. 2A is a cross-sectional view of the electronic device of the present embodiment along the line I-I' indicated in FIG. 1. The substrate 11 used in the electronic device of the present embodiment is a driving substrate with a circuit layer 111 formed thereon, and the electronic modules 12 are electrically connected to the circuit layer 111 on the substrate 11 through conductive elements 123. The electronic modules 12 used in the electronic device of the present embodiment may respectively comprise: a first substrate 122; and a plurality of electronic elements 121 disposed on the first substrate 122. Herein, the substrate 11 and the first substrate 122 may respectively comprise a printed circuit board (PCB), a quartz substrate, a glass substrate, a wafer, a sapphire substrate, or etc. Alternatively, the substrate 11 and the first substrate 122 may also respectively comprise a flexible substrate or a film, and the material of which can comprise polycarbonate (PC), polyimide (PI), polypropylene (PP), polyethylene terephthalate (PET), other plastic or polymer materials, or the combination thereof. When the flexible substrate or the film is used, the electronic device can be a flexible electronic device. However, the present disclosure is not limited thereto.

As shown in FIG. 2A, the electronic modules 12 are electrically connected to the circuit layer 111 on the substrate 11 through conductive elements 123. The conductive elements 123 can respectively be a solder bump, a metal pillar, or a medium including conductive particles. The conductive elements 123 may respectively comprise Ag, Al, Ni, Cr, Cu, Au, Pd, Pt, Sn, W, Rh, Jr, Ru, Mg, Zn, an alloy thereof, or a combination thereof, but the present disclosure is not limited to. Alternatively, the conductive elements 123 can be formed by using conductive paste such as Ag paste or an anisotropic conductive film (ACF), but the present disclosure is not limited thereto.

As show in FIG. 1 and FIG. 2A, the electronic device of the present embodiment comprises the sensing elements 13 disposed on the substrate 11, and the electronic modules 12 are arranged in a manner to expose the sensing elements 13. In the present disclosure, the term "the electronic modules 12 are arranged in a manner to expose the sensing elements 13" refers to the situation that signals emitted by the electronic modules 12 can be sensed by the sensing elements 13 no matter whether or not the sensing elements 13 are overlapped with the electronic modules 12 in the normal direction Z of the substrate 11. Thus, in the situations that the sensing elements 13 are completely overlapped, are partially overlapped, or are not overlapped with the electronic modules 12 in the normal direction Z of the substrate 11, the sensing elements 13 can be considered to be exposed from the electronic modules 12 when the signals emitted by the electronic modules 12 can be sensed by the sensing elements 13.

Further, in the present disclosure, the term "signals emitted by the electronic modules can be sensed by the sensing element" or "the electronic modules are sensed by the sensing element" means the signals sensed by the sensing element 13 are emitted by one or more electronic elements 121 disposed on the electronic modules 12. More specifically, the sensing element 13 can receive the dedicated signals emitted by one or more electronic elements 121, or detect the strength of the outputs (such as light or heat) emitted by one or more electronic elements 121.

Figure 3A:
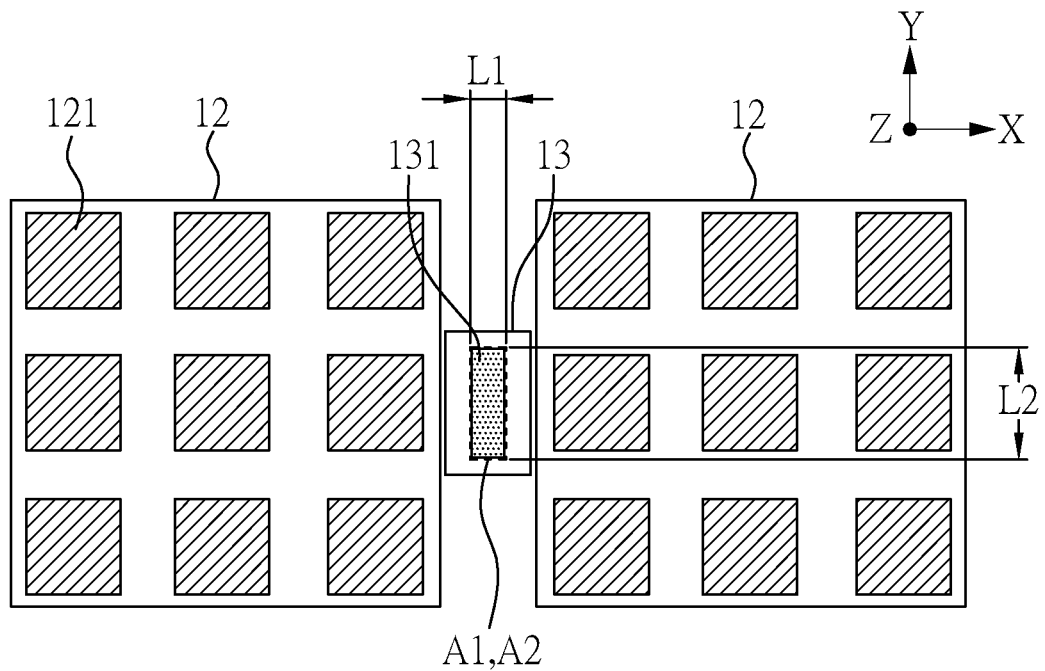
FIG. 3A and FIG. 3B are top views showing the relationships between electronic modules and sensing elements according to different aspects of the present disclosure.

FIG. 3A is a top view showing the relationship between electronic modules 12 and sensing elements 13 of the present embodiment, which are enlarged views of a part of the electronic device shown in FIG. 1. More specifically, as shown in FIG. 1, FIG. 2A and FIG. 3A, the sensing element 13 comprises a semiconductor layer 131, and the electronic modules 12 are arranged in a manner to expose the semiconductor layer 131 of the sensing element 13. In the present disclosure, the term "the electronic modules 12 arranged in a manner to expose the semiconductor layer 131 of the sensing element 13" refers to the situation that signals emitted by the electronic modules 12 can be sensed by the semiconductor layer 131 of the sensing elements 13 no matter whether or not the semiconductor layer 131 of the sensing elements 13 are overlapped with the electronic modules 12 in the normal direction Z of the substrate 11. Thus, in the situations that the semiconductor layer 131 of the sensing elements 13 are completely overlapped, are partially overlapped, or are not overlapped with the electronic modules 12 in the normal direction Z of the substrate 11, the semiconductor layer 131 of the sensing elements 13 can be considered to be exposed from the electronic modules 12 when the signals emitted by the electronic modules 12 can be sensed by the sensing elements 13.

Figure 2B:
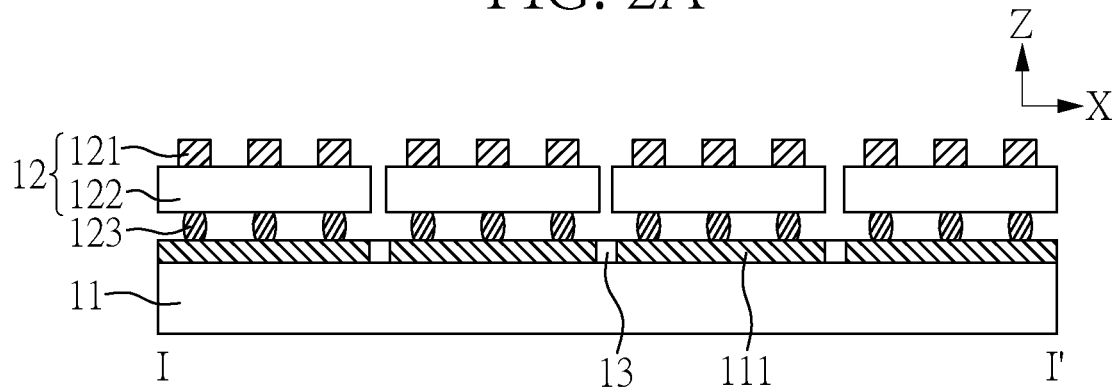
Figure 3B:
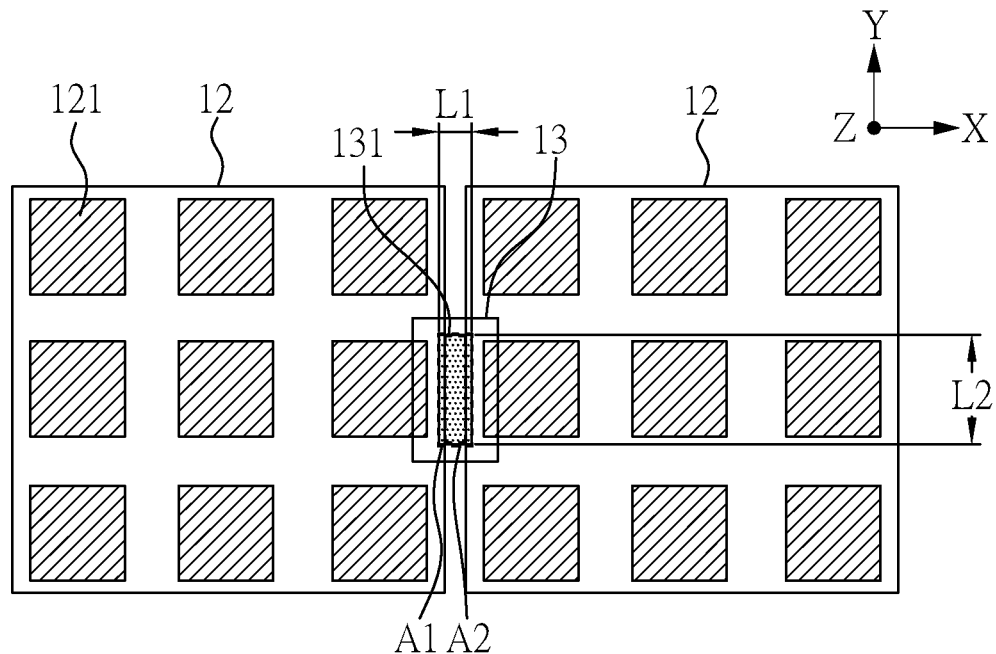

FIG. 2A and FIG. 3A show that the sensing element 13, especially the semiconductor layer 131 is not overlapped with the electronic modules 12 in the normal direction Z of the substrate 11. In another embodiment of the present disclosure, the gaps between two adjacent electronic modules 12 shown in FIG. 2B and FIG. 3B are narrower than the gap between two adjacent electronic modules 12 shown in FIG. 2A and FIG. 3A, and the sensing element 13, especially the semiconductor layer 131, is partially overlapped with the electronic modules 12 in the normal direction Z of the substrate 11. Herein, the electronic modules 12 may comprise other elements (for example, a reflective element) capable of introducing the signals emitted by the electronic modules 12 into the sensing element 13, so the sensing element 13, especially the semiconductor layer 131, can detect the signals.

In further another embodiment of the present disclosure, even not shown in the figure, the sensing elements 13 are not disposed at the gap between two adjacent electronic modules 12 but may be disposed under the electronic modules 12 and near the gap, and the electronic modules 12 may comprise other elements (for example, a reflective element) capable of introducing the signals emitted by the electronic modules 12 into the sensing elements 13, so the sensing elements 13 can detect the signals. Thus, even though the sensing elements 13 are disposed under the electronic modules 12 and are completely overlapped with the electronic modules 12 in the normal direction Z of the substrate 11, the sensing elements 13, especially the semiconductor layers 131, still can sense the signals emitted by the electronic modules 12.

In one embodiment of the present embodiment, other optical elements such as micro-lenses may be disposed on the sensing elements 13 to facilitate the sensing elements 13 sensing the signals emitted by the electronic modules 12.

In the electronic device of the present embodiment, the electronic elements 121 are light emitting diodes, antenna units or a combination thereof. In one embodiment of the present disclosure, the electronic elements 121 are light emitting diodes. Herein, the light emitting diodes capable of using in the electronic device of the present embodiment can be organic light-emitting diodes (OLED), normal light-emitting diodes (normal LEDs), mini light-emitting diodes (mini-LEDs), micro light-emitting diodes (micro-LEDs), or quantum-dot light-emitting diodes (QLEDs or QD-LEDs). In some embodiments of the present disclosure, the light emitting diode can emit visible light, laser, infrared, or ultraviolet (UV) light, but the present disclosure is not limited thereto.

As shown in FIG. 3A and FIG. 3B, the semiconductor layer 131 has a first area A1, the semiconductor layer 131 has a second area A2 being exposed by the electronic modules 12, and a ratio of the second area A2 to the first area A1 is in a range from 1/3 to 1 (1/3≤A2/A1≤1). More specifically, the semiconductor layer 131 has a first area A1, at least a part of the semiconductor layer 131 not overlapped with the electronic modules 12 in a normal direction Z of the substrate 11 (as shown in FIG. 1) has a second area A2, and a ratio of the second area A2 to the first area A1 is in a range from 1/3 to 1 (1/3≤A2/A1≤1). In the aspect shown in FIG. 3A, the semiconductor layer 131 are not overlapped with the electronic modules 12 in a normal direction Z of the substrate 11 (as shown in FIG. 1), so the ratio of the second area A2 to the first area A1 is 1. In the aspect shown in FIG. 3B, a part of the semiconductor layer 131 are overlapped with the electronic modules 12 in the normal direction Z, so the ratio of the second area A2 to the first area A1 is less than 1 but equal to or greater than 1/3.

As shown in FIG. 3A and FIG. 3B, two adjacent electronic modules 12 are separated from each other in a first direction X to expose the sensing element 13, the semiconductor layer 131 of the sensing element 13 has a first length L1 in the first direction X and a second length L2 in a second direction Y different from the first direction X, and the first length L1 is less than the second length L2. In some embodiments of the disclosure, the first direction X is perpendicular to the second direction Y. When the second length L2 increases, the first area A1 of the semiconductor layer 131 can be increased. Thus, the sensitivity or accuracy of the sensing element 13 can be enhanced.

Figures 4A, 4B:
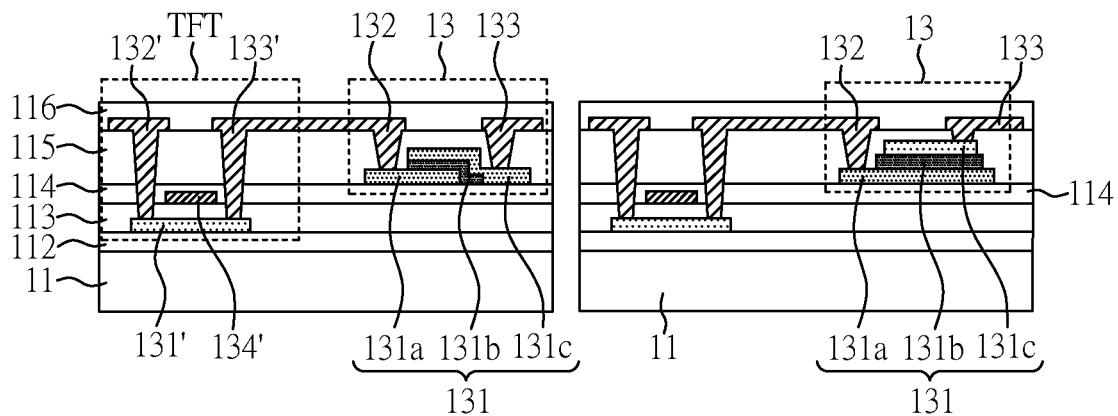
FIG. 4A to FIG. 4D are cross-sectional views of sensing elements according to different aspects of the present disclosure.

FIG. 4A to FIG. 4D are cross-sectional views of sensing elements according to different aspects of the present disclosure. As shown in FIG. 4A, a first insulating layer 112 is disposed on the substrate 11, a driving semiconductor layer 131' is disposed on the first insulating layer 112, a gate insulating layer 113 is disposed on the driving semiconductor layer 131', a first gate electrode 134' is disposed on the gate insulating layer 113, a third insulating layer 114 is disposed on the first gate electrode 134', a semiconductor layer 131 is disposed on the third insulating layer 114, a fourth insulating layer 115 is disposed on the semiconductor layer 131, a first electrode 132, a second electrode 133, a third electrode 132' and a fourth electrode 133' are disposed on the fourth insulating layer 115, and a planer layer 116 is disposed on the first electrode 132, the second electrode 133, the third electrode 132' and the fourth electrode 133'. The driving semiconductor layer 131', the first gate electrode 134', the third electrode 132' and the fourth electrode 133' constitute a transistor TFT which is comprised in the circuit layer 111 (as shown in FIG. 2A). Herein, the transistor is a top gate transistor, and the transistor can be a bottom gate transistor in another embodiment of the present disclosure. In addition, the sensing element 13 is a PIN type sensing element, but the present disclosure is not limited thereto. The sensing element 13 comprises: the semiconductor layer 131; the first electrode 132 electrically connected to the semiconductor layer 131; and the second electrode 133 electrically connected to the semiconductor layer 131. More specifically, the semiconductor layer 131 comprises a first semiconductor layer 131a, a second semiconductor layer 131b and a third semiconductor layer 131c sequentially laminated on the substrate 11. One of the first semiconductor layer 131a and the third semiconductor layer 131c is a p-doped semiconductor layer, the other one is an n-doped semiconductor layer, and the second semiconductor layer 131b is an intrinsic semiconductor layer (also called as a depletion layer). The first electrode 132 is electrically connected to the fourth electrode 133', so the transistor TFT can drive the sensing element 13.

The structure shown in FIG. 4B is similar to that shown in FIG. 4A, except for the structure of the sensing element 13. In FIG. 4A, a part of the second semiconductor layer 131b and a part of the third semiconductor layer 131c are disposed on the third insulating layer 114. In FIG. 4B, the second semiconductor layer 131b is only disposed on the first semiconductor layer 131a, and the third semiconductor layer 131c is only disposed on the second semiconductor layer 131b.

In the present disclosure, the first area A1 and the second area A2 indicated in FIG. 3A and FIG. 3B are defined by the area of the overall semiconductor layer 131 including the first semiconductor layer 131a, the second semiconductor layer 131b and the third semiconductor layer 131c shown in FIG. 4A and FIG. 4B.

Figures 4C, 4D:
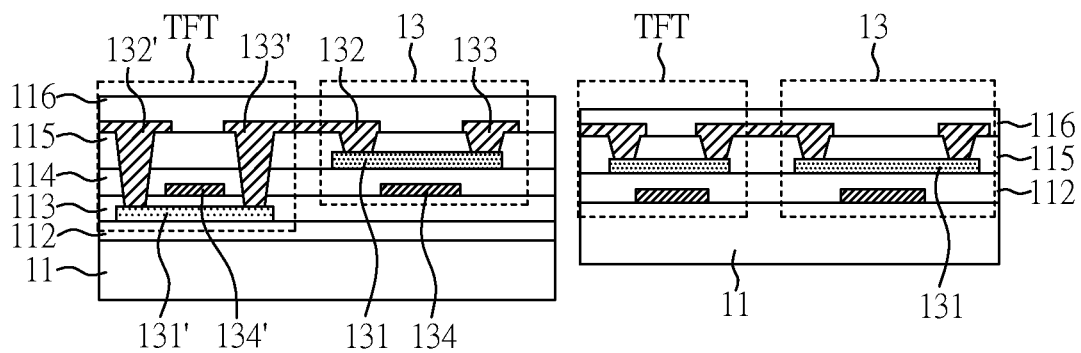

As shown in FIG. 4C, a first insulating layer 112 is disposed on the substrate 11, a driving semiconductor layer 131' is disposed on the first insulating layer 112, a gate insulating layer 113 is disposed on the driving semiconductor layer 131', a first gate electrode 134' and a second gate electrode 134 are disposed on the gate insulating layer 113, a third insulating layer 114 is disposed on the first gate electrode 134' and the second gate electrode 134, a semiconductor layer 131 is disposed on the third insulating layer 114, a fourth insulating layer 115 is disposed on the semiconductor layer 131, a first electrode 132, a second electrode 133, a third electrode 132' and a fourth electrode 133' are disposed on the fourth insulating layer 115, and a planer layer 116 is disposed on the first electrode 132, the second electrode 133, the third electrode 132' and the fourth electrode 133'. The sensing element 13 is a TFT type sensing element, which comprises: the second gate electrode 134; the semiconductor layer 131 corresponding to the second gate electrode 134; the first electrode 132 electrically connected to the semiconductor layer 131; and the second electrode 133 electrically connected to the semiconductor layer 131. Similarly, the first electrode 132 is electrically connected to the fourth electrode 133', so the transistor TFT can drive the sensing element 13.

The structure shown in FIG. 4D is similar to that shown in FIG. 4C, except that the transistor TFT shown in FIG. 4D is a bottom gate transistor.

As shown in FIG. 4A to FIG. 4D, the first insulating layer 112, the gate insulating layer 113, the third insulating layer 114, the fourth insulating layer 115 and the planer layer 116 may respectively comprise silicon oxide, silicon oxynitride, silicon nitride, aluminum oxide, resin, polymer, photoresist, or a combination thereof. The first gate electrode 134', the second gate electrode 134, the first electrode 132, the second electrode 133, the third electrode 132' and the fourth electrode 133' may respectively comprise Cu, Al, Mo, W, Au, Cr, Ni, Pt, Ti, alloy thereof, other suitable metal, a combination thereof, or other conductive material with good conductivity or small resistance. The first semiconductor layer 131a, the second semiconductor layer 131b, the third semiconductor layer 131c, the driving semiconductor layer 131' or the semiconductor layer 131 may comprise amorphous silicon, polycrystalline-silicon, or metal oxide such as IGZO (indium gallium zinc oxide), AIZO (aluminum indium zinc oxide), HIZO (hafnium indium zinc oxide), ITZO (indium tin zinc oxide), IGZTO (indium gallium zinc tin oxide), or IGTO (indium gallium tin oxide).

The sensing elements 13 shown in FIG. 4A to FIG. 4D can be used alone or in combination in the electronic device of the present disclosure. However, the present disclosure is not limited thereto, and other type of sensing elements or other type of driving elements for driving the sensing element may also be used in the electronic device of the present disclosure.

Herein, the sensing elements 13 can be formed together with the circuit layer 111 shown in FIG. 2A and FIG. 2B, so there is no need to form the sensing elements 13 by another manufacturing process or to additionally dispose the sensing elements 13 on the substrate 11. Thus, the cost for forming the sensing elements 13 can be reduced. But in another embodiment of the present disclosure, at least one of the sensing elements 13 are externally disposed on the substrate 11, and electrically connect to the circuit layer 111 which is shown in FIG. 2A and FIG. 2B. When the sensing element 13 is out of function, the external sensing element 13 can be replaced more easily.

Figure 5A:
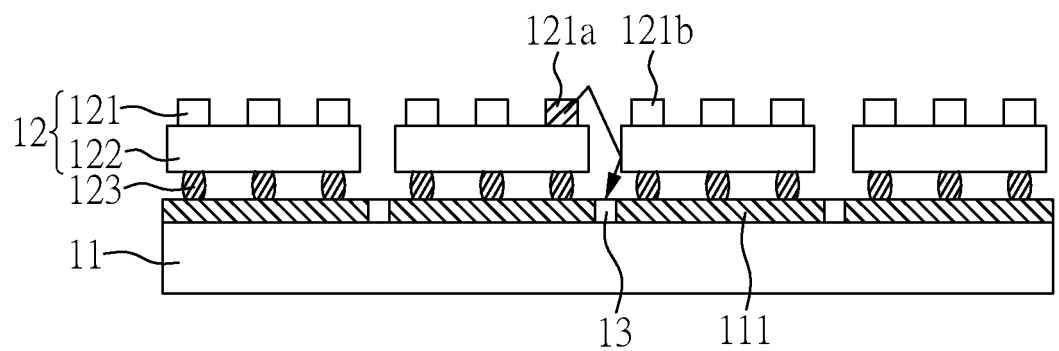
FIG. 5A and FIG. 5B are cross-sectional views showing first signals emitted by one of the electronic modules and sensed by sensing elements according to one embodiment of the present disclosure.
Figure 5B:
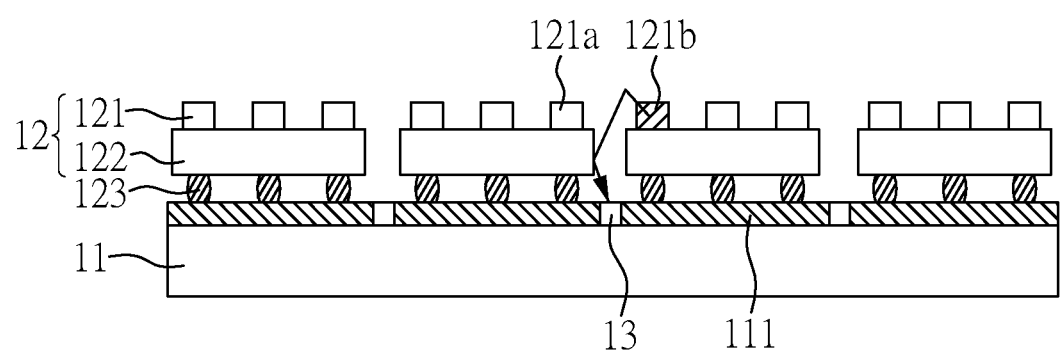

Hereinafter, the functions of the sensing elements 13 are described in detail. FIG. 5A and FIG. 5B are cross-sectional views showing first signals emitted by one of the electronic modules and sensed by sensing elements according to one embodiment of the present disclosure, wherein the electronic elements 121 in the enabled state are present with filling patterns, and the electronic elements 121 in the disabled state are present with blank.

As shown in FIG. 5A and FIG. 5B, at least two of the electronic modules 12 are sensed by at least one of the sensing elements 13. More specifically, at least two first signals respectively emitted by at least two of the electronic modules 12 are sensed by at least one of the sensing elements 13. In the present disclosure, examples of the first signal may comprise light, heat, electromagnetic wave, radio frequency wave, etc. Thus, the sensing elements 13 can be photo sensors, thermal sensors, electromagnetic wave sensors, radio frequency wave sensors or a combination thereof.

In the present embodiment, as shown in FIG. 5A, the electronic element 121a is in the enabled state and the electronic element 121b is in the disabled state, and the first signal emitted by the electronic element 121a of the electronic modules 12 disposed on the left side of the sensing element 13 can be sensed by the sensing element 13. Then, as shown in FIG. 5B, the electronic element 121b is in the enabled state and the electronic element 121a is in the disabled state, and the first signal emitted by the electronic element 121b of the electronic modules 12 disposed on the right side of the sensing element 13 can be sensed by the sensing element 13. It should be noted that the signals emitted by the electronic element 121a and the signal emitted by the electronic element 121b may be identical or different.

After the sensing element 13 receive the first signals emitted by the electronic elements 121a or 121b, the sensing element 13 can output at least one second signal according to the first signals. Then, the controller 14 (as shown in FIG. 1) can calibrate the electronic modules 12, in which the electronic elements 121a, 121b are comprised therein, according to the at least one second signal.

In the electronic device of the present embodiment, the electronic elements 121 are light emitting diodes, antenna units or a combination thereof. In one embodiment of the present disclosure, the electronic elements 121 are light emitting diodes. Herein, the light emitting diodes capable of using in the electronic device of the present embodiment can be organic light-emitting diodes (OLED), normal light-emitting diodes (normal LEDs), mini light-emitting diodes (mini-LEDs), micro light-emitting diodes (micro-LEDs), or quantum-dot light-emitting diodes (QLEDs or QD-LEDs). In some embodiments of the present disclosure, the light emitting diode can emit visible light, laser, infrared, or ultraviolet (UV) light, but the present disclosure is not limited thereto.

When the electronic elements 121 are light emitting diodes, the electronic device of the present embodiment is a tiled LED display device. The tiled LED display device is constituted by electronic modules 12, and the properties (such as electrical impedance, hues of LEDs, etc.) of each electronic module 12 may be different, resulting in that the image displayed on the tiled LED display device is non-uniform. In the present embodiment, as shown in FIG. 5A and FIG. 5B, the first signals emitted by the electronic elements 121a, 121b of different electronic modules 12 can be sensed by the sensing element 13, so the non-uniformity caused by the difference between the properties of the electronic modules 12 corresponding to the electronic elements 121a, 121b can be detected by the sensing element 13. When the sensing element 13 receives the first signals from the electronic elements 121a, 121b and outputs at least one second signal corresponding to the first signals to the controller 14 (as shown in FIG. 1), the controller 14 can calibrate the outputs of the electronic modules 12 corresponding to first signals of the electronic elements 121a, 121b to solve the problem of non-uniform image. In addition, by disposing the sensing element 13 in the tiled display device, there is no need to dispose additional IC chips corresponding to each electronic module 12, and the cost of the tiled display device can be reduced.

As shown in FIG. 5A and FIG. 5B, the first signals are sequentially emitted by the electronic modules 12 where the electronic elements 121*a*, 121*b* are disposed. In other embodiment, the first signals can be simultaneously emitted by the electronic modules 12.

Figure 6A:
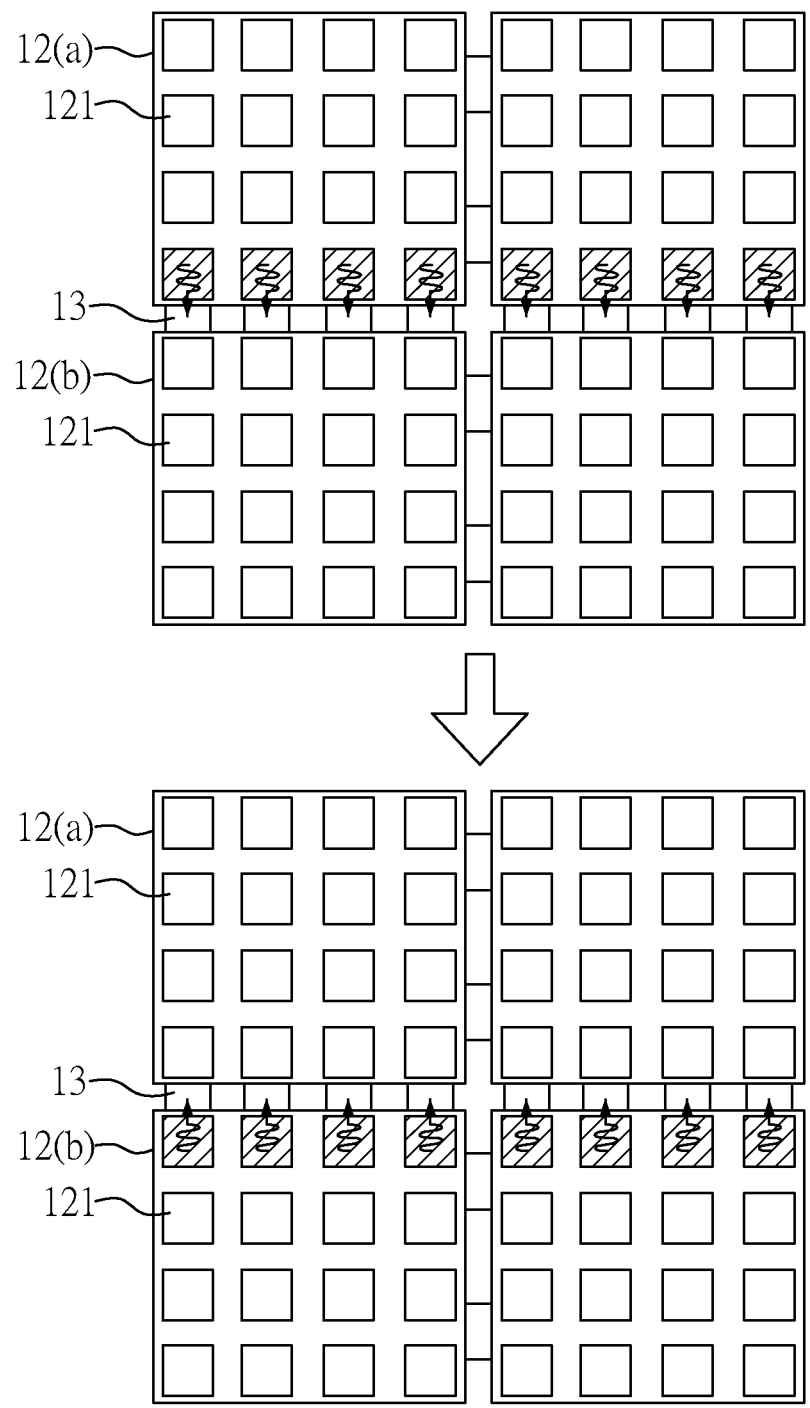
FIG. 6A and FIG. 6B are top views showing first signals sequentially emitted by electronic modules according to different embodiments of the present disclosure.
Figure 6B:
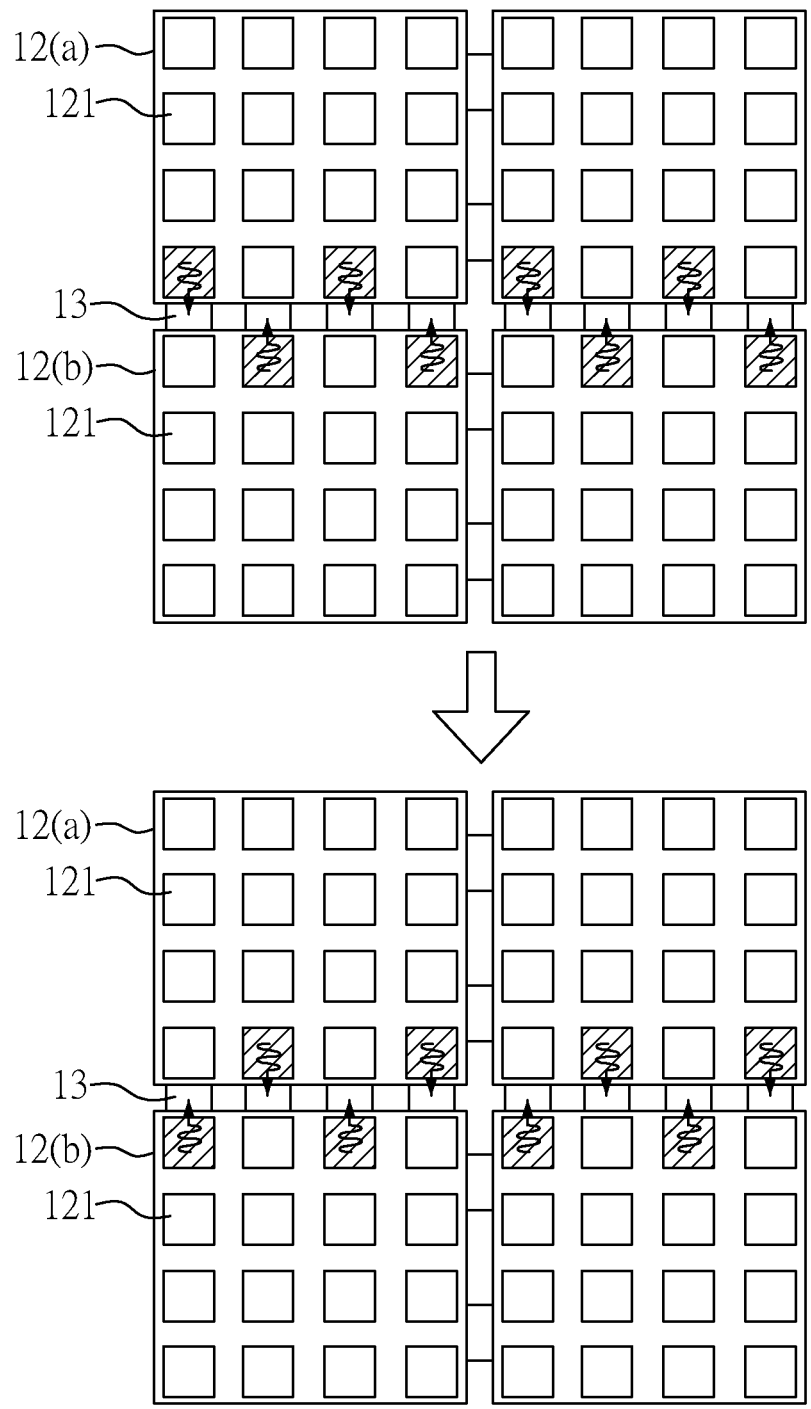

FIG. 6A and FIG. 6B are top views showing first signals sequentially emitted by electronic modules according to different embodiments of the present disclosure, wherein the electronic elements 121 in the enabled state are present with filling patterns, and the electronic elements 121 in the disabled state are present with blank. As shown in FIG. 6A, the electronic elements 121 of one electronic module 12(*a*) adjacent to the sensing elements 13 are in the enabled state first, and the sensing elements 13 can sense the first signals emitted from the electronic elements 121 of the electronic module 12(*a*) in the enabled state. Next, the electronic elements 121 of another electronic module 12(*b*) adjacent to the sensing elements 13 are in the enabled state, and the sensing elements 13 can sense the first signals emitted from the electronic elements 121 of the electronic module 12(*b*) in the enabled state. In another embodiment of the present disclosure, as shown in FIG. 6B, a portion of the electronic elements 121 of the electronic modules 12(*a*), 12(*b*) adjacent to the sensing elements 13 are in the enabled state first, and the sensing elements 13 can sense the first signals emitted by these electronic elements 121 of the electronic modules 12(*a*), 12(*b*) in the enabled state. Next, another portion of the electronic elements 121 of the electronic modules 12(*a*), 12(*b*) adjacent to the sensing elements 13 are in the enabled state, and the sensing elements 13 can sense the first signals emitted by the electronic modules 12(*a*), 12(*b*) in the enabled state. FIG. 6A and FIG. 6B show the examples that the first signals are sequentially emitted by the electronic elements 121 of the electronic modules 12(*a*), 12(*b*) and the sensing elements 13 sense the first signals emitted by the electronic modules 12(*a*), 12(*b*) in the enabled state. However, the present disclosure is not limited thereto. The number or the arrangement the electronic elements 121 in the enabled state can be adjusted according to the actual demand.

Figure 7:
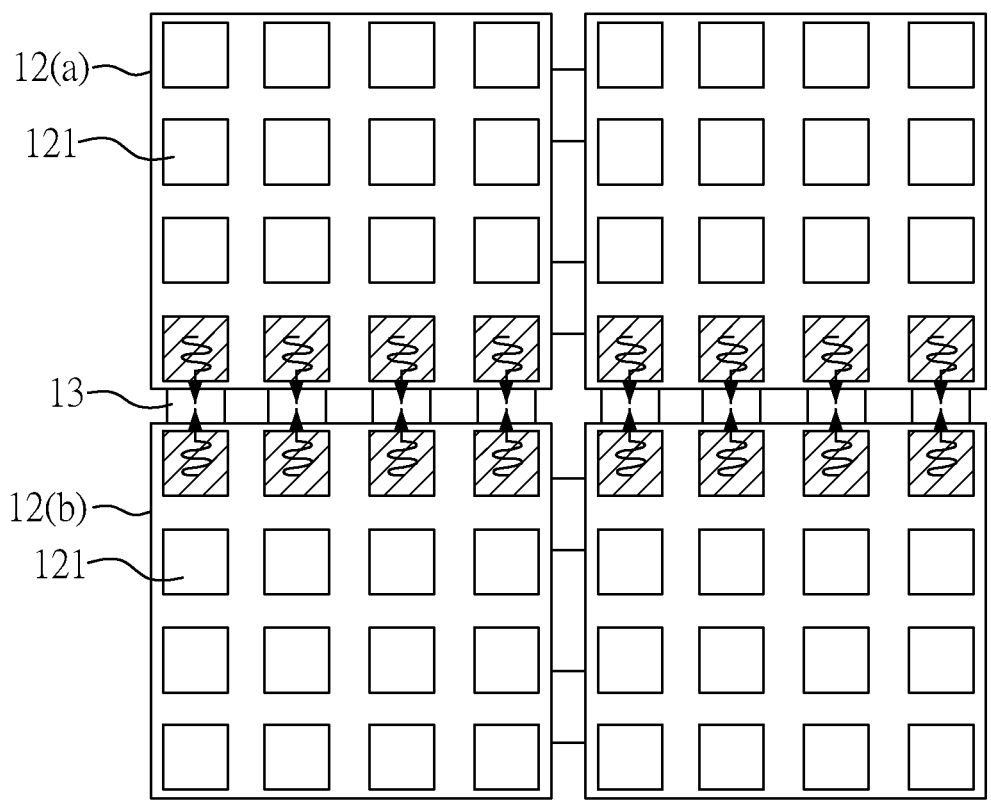
FIG. 7 is a top view showing first signals simultaneously emitted by electronic modules according to one embodiment of the present disclosure.

FIG. 7 is a top view showing first signals simultaneously emitted by electronic modules according to one embodiment of the present disclosure, wherein the electronic elements 121 in the enabled state are present with filling patterns, and the electronic elements 121 in the disabled state are present with blank. As shown in FIG. 7, all the electronic elements 121 of the electronic modules 12(*a*), 12(*b*) adjacent to the sensing elements 13 are simultaneously in the enabled state, and the sensing elements 13 can sense the first signals emitted by the electronic elements 121 of the electronic modules 12(*a*), 12(*b*) in the enabled state. FIG. 7 shows the example that the first signals are simultaneously emitted by the electronic elements 121*a*, 121*b* of the electronic modules 12 and the sensing elements 13 sense the first signals emitted by the electronic elements 121 of the electronic modules 12(*a*), 12(*b*) in the enabled state. However, the present disclosure is not limited thereto. The number or the arrangement the electronic elements 121 in the enabled state can be adjusted according to the actual demand.

FIG. 8A to FIG. 8F are top views of electronic devices according to different embodiments of the present disclosure. In some embodiments of the present disclosure, the electronic modules 12 can be arranged in an array. In other embodiments of the present disclosure, the electronic modules 12 may not be arranged in an array. However, as long as the sensing elements 13 are disposed between at least two adjacent electronic modules 12 so that the sensing elements 13 can sense the signals from the electronic modules 12, the arrangement of the electronic modules 12 is not limited to those shown in FIG. 8A to FIG. 8F and can be adjust according to the actual demand.

Figure 8A:
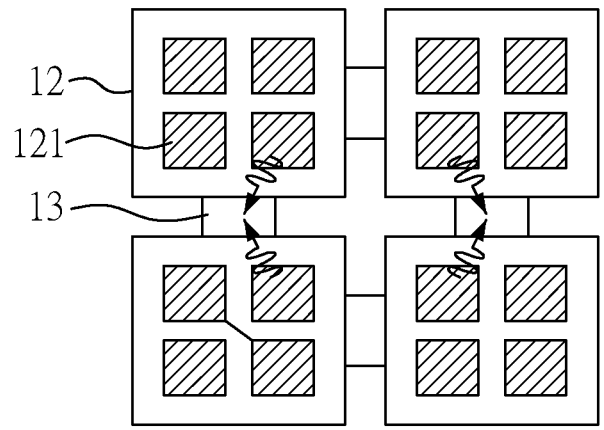
FIG. 8A to FIG. 8F are top views of electronic devices according to different embodiments of the present disclosure.
Figure 8B:
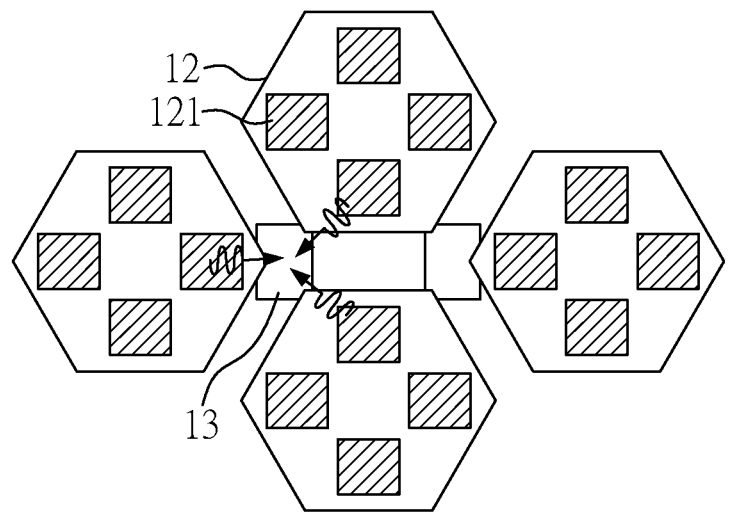
Figure 8C:
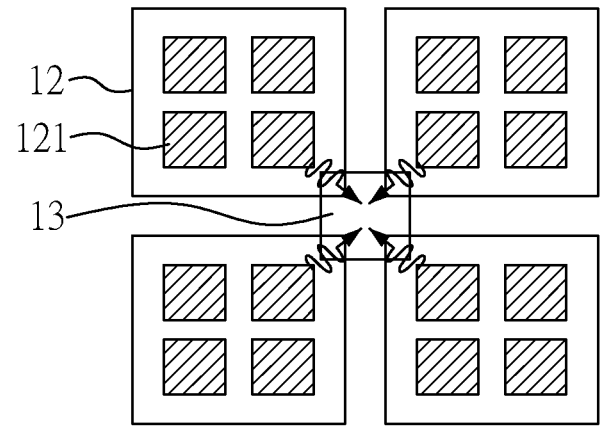
Figure 8D:
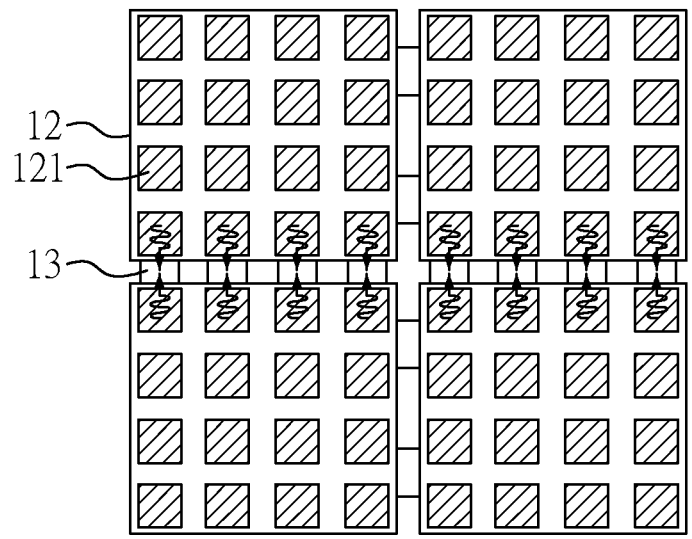

In addition, as shown in FIG. 8A, and FIG. 8C to FIG. 8F, the electronic modules 12 have rectangle shapes. As shown in FIG. 8B, the electronic modules 12 have hexagon shapes. However, the present disclosure is not limited thereto, and the electronic modules 12 may have other shapes.

Figure 8E:
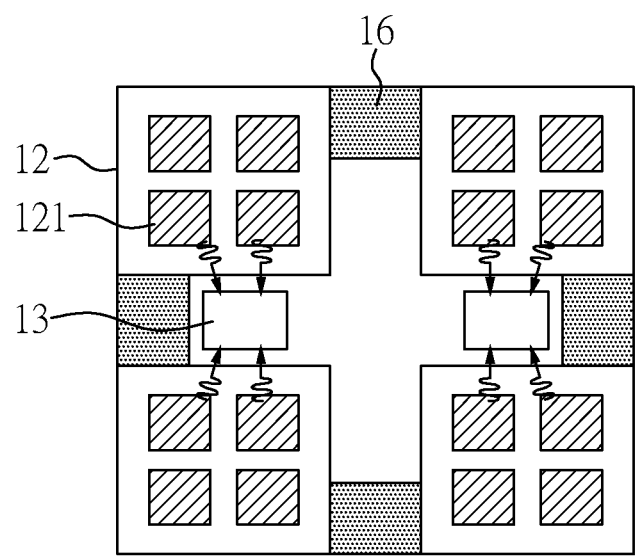
Figure 8F:
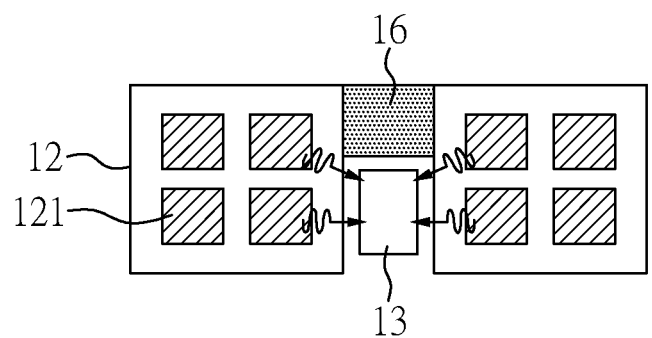

Furthermore, as shown in FIG. 8E and FIG. 8F, the electronic device may further comprise at least one connector 16 connecting two of the electronic modules 12. In one embodiment of the present disclosure, the connector 16 may be a circuit board electrically connecting to the electronic modules 12. In another embodiment of the present disclosure, the connector 16 may be a connecting substrate which physically connect to but does not electrically connect to the electronic modules 12.

Figure 9:
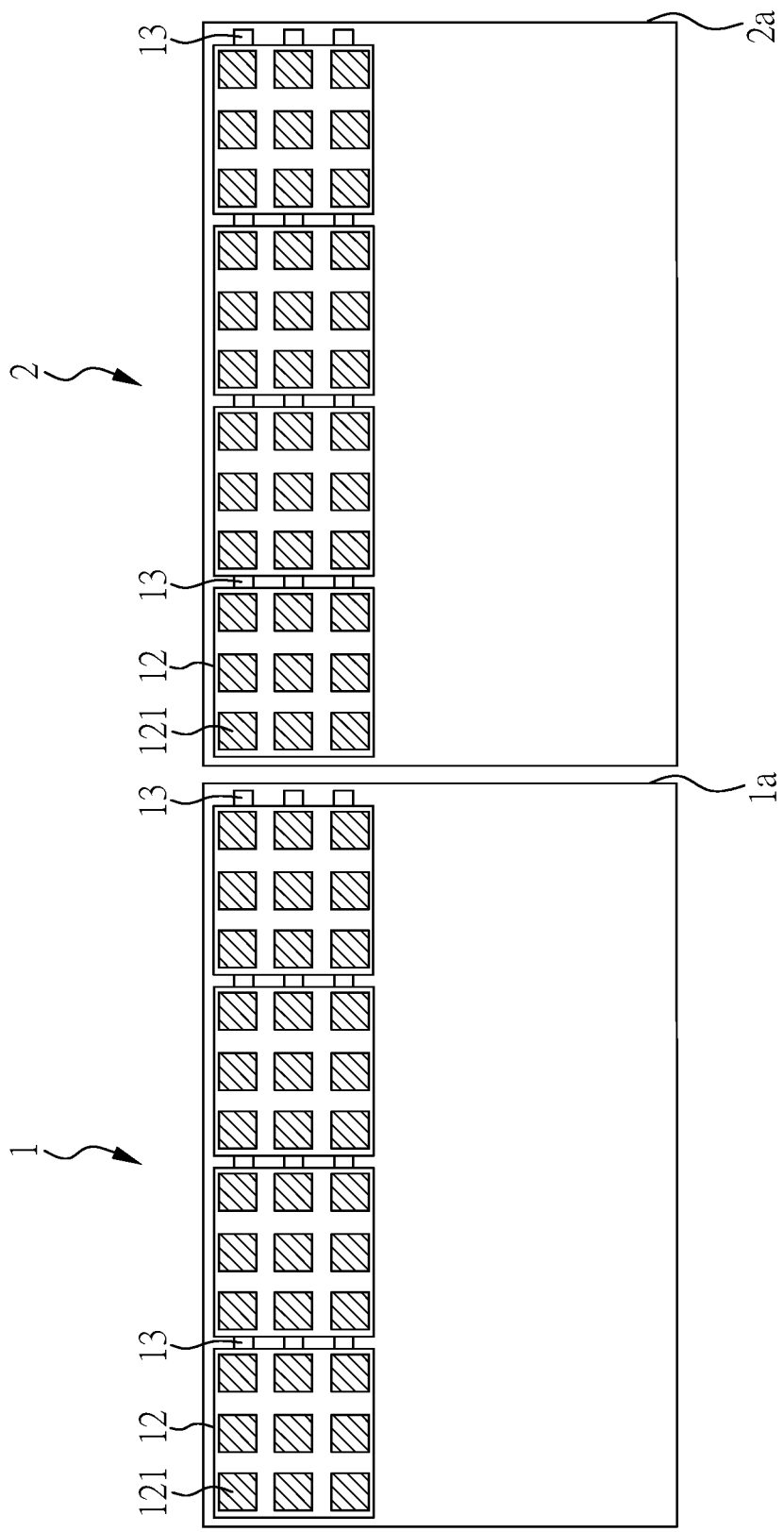
FIG. 9 is a perspective view of an electronic system according to one embodiment of the present disclosure.

FIG. 9 is a perspective view of an electronic system according to one embodiment of the present disclosure. The electronic system of the present embodiment comprises at least two electronic devices 1, 2, so the electronic system of the present embodiment is a tiled electronic system. The electronic device 1, 2 are similar to those shown in FIG. 1, except that the electronic devices 1, 2 may further comprise additional sensing elements 13 disposed near the edges 1*a*, 2*a* of the electronic devices 1, 2. Thus, the sensing elements 13 disposed near the edge 1*a* of the electronic device 1 can detect the electronic modules 12 of the electronic devices 1, 2.

When the electronic device made as described in any of the embodiments of the present disclosure is a display device, the electronic device can be applied to any electronic devices that need a display screen, such as displays, mobile phones, laptops, video cameras, still cameras, music players, mobile navigators, TV sets, public information displays, and other electronic devices that display images. When the tiled electronic system made as described in any of the embodiments of the present disclosure is a tiled display system, the tiled electronic system can be applied to any electronic devices that need to display large images, such as video walls, and advertising boards.

Although the present disclosure has been explained in relationship to its embodiment, it is to be understood that many other possible modifications and variations can be made without departing from the spirit and scope of the disclosure as hereinafter claimed.

What is claimed is:

1. A tiled display device, comprising:
    a substrate;
    a plurality of sensing elements disposed on the substrate, wherein at least one of the plurality of sensing elements comprises a semiconductor layer; and
    a plurality of electronic modules disposed on the substrate, each electronic module comprising a plurality of electronic elements,
    wherein the plurality of electronic modules are arranged in a manner to expose the semiconductor layer of the at least one of the plurality of sensing elements, the semiconductor layer has a first area, at least a part of the semiconductor layer not overlapped with the plurality of electronic modules in a normal direction of the substrate has a second area, and a ratio of the second area to the first area is in a range from 1/3 to 1.

2. The tiled display device of claim 1, wherein at least two of the plurality of electronic modules are sensed by the at least one of the plurality of sensing elements.

3. The tiled display device of claim 2, wherein at least two first signals respectively emitted by at least two of the plurality of electronic modules are sensed by the at least one of the plurality of sensing elements.

4. The tiled display device of claim 3, wherein the at least one of the plurality of sensing elements outputs at least one second signal according to the at least two first signals.

5. The tiled display device of claim 4, further comprising a controller calibrating the plurality of electronic modules according to the at least one second signal.

6. The tiled display device of claim 1, wherein the semiconductor layer has the second area being exposed by the plurality of sensing elements.

7. The tiled display device of claim 1, wherein two of the plurality of electronic modules are separated from each other in a first direction to expose one of the plurality of sensing elements, the semiconductor layer has a first length in the first direction and a second length in a second direction perpendicular to the first direction, and the first length is less than the second length.

8. The tiled display device of claim 1, further comprising at least one connector connecting two of the plurality of electronic modules.

9. The tiled display device of claim 1, wherein the plurality of electronic modules are arranged in juxtaposition.

10. The tiled display device of claim 1, wherein one of the plurality of sensing elements is a photo sensor, a thermal sensor, or a radio frequency wave sensor.

11. A tiled display device, comprising:
a substrate;
a plurality of sensing elements disposed on the substrate, wherein at least one of the plurality of sensing elements comprises a semiconductor layer; and
a plurality of electronic modules disposed on the substrate, each electronic module comprising a plurality of electronic elements,
wherein at least two of the plurality of electronic modules are sensed by at least one of the plurality of sensing elements, the semiconductor layer has a first area, at least a part of the semiconductor layer not overlapped with the plurality of electronic modules in a normal direction of the substrate has a second area, and a ratio of the second area to the first area is in a range from 1/3 to 1.

12. The tiled display device of claim 11, wherein at least two first signals respectively emitted by the at least two of the plurality of electronic modules are received by the at least one of the plurality of sensing elements.

13. The tiled display device of claim 12, wherein the at least one of the plurality of sensing elements outputs at least one second signal according to the at least two first signals.

14. The tiled display device of claim 13, further comprising a controller calibrating the at least tow of the plurality of electronic modules according to the at least one second signal.

15. The tiled display device of claim 12, wherein the at least two of the plurality of electronic modules emit the at least two first signals sequentially or simultaneously.

16. The tiled display device of claim 12, wherein the at least two first signals are received by the at least one of the plurality of sensing clement elements sequentially or simultaneously.

17. A tiled display device, comprising:
a substrate;
a plurality of sensing elements disposed on the substrate, wherein at least one of the plurality of sensing elements comprises a semiconductor layer; and
a plurality of electronic modules disposed on the substrate;
wherein at least one of the plurality of electronic modules comprises a plurality of electronic elements, and the plurality of electronic modules are arranged in a manner to expose the semiconductor layer of the at least one of the plurality of sensing elements, the semiconductor layer has a first area, at least a part of the semiconductor layer not overlapped with the plurality of electronic modules in a normal direction of the substrate has a second area, and a ratio of the second area to the first area is in a range from 1/3 to 1.

18. The tiled display device of claim 17, further comprising a controller, wherein first signals are respectively emitted by at least two of the plurality of electronic modules, at least one of the plurality of sensing elements outputs at least one second signal according to the first signals, and the controller calibrates the at least tow of the plurality of electronic modules according to the at least one second signal.

* * * * *